United States Patent [19]
Oh

[11] Patent Number: 6,038,196
[45] Date of Patent: Mar. 14, 2000

[54] SEMICONDUCTOR MEMORY DEVICE HAVING A SYNCHRONOUS DRAM

[75] Inventor: Hak June Oh, Kyoungki-do, Rep. of Korea

[73] Assignee: Hyundai Electronics Industries Co., Ltd., Kyoungki-do, Rep. of Korea

[21] Appl. No.: 09/057,616

[22] Filed: Apr. 9, 1998

[30] Foreign Application Priority Data

Apr. 9, 1997 [KR] Rep. of Korea ................... 97 12988

[51] Int. Cl.[7] ................................................. G11C 8/00
[52] U.S. Cl. ........................ 365/236; 365/191; 365/222; 365/230.06
[58] Field of Search ........................... 365/236, 230.06, 365/222, 191

[56] References Cited

U.S. PATENT DOCUMENTS

| 5,446,696 | 8/1995 | Ware et al. | 365/222 |
| 5,659,515 | 8/1997 | Matsuo et al. | 365/222 |
| 5,812,488 | 9/1998 | Zagar et al. | 365/236 X |
| 5,867,438 | 2/1999 | Nomura et al. | 365/236 X |

*Primary Examiner*—Do Hyun Yoo
*Attorney, Agent, or Firm*—Thelen Reid & Priest, LLP

[57] ABSTRACT

This invention relates to a semiconductor memory device and uses a row address counter as well as an internal column address counter for a burst write and read. One address counter which is a combination of a refresh address counter and a burst column address counter is provided to decrease chip area and simulation time of operation waveform.

5 Claims, 6 Drawing Sheets

SEMICONDUCTOR MEMORY DEVICE HAVING A SYNCHRONOUS DRAM

FIELD OF THE INVENTION

This invention relates to a semiconductor memory device, in particular to a semiconductor memory device which can decrease chip area and simulation time of operation waveform by using one address counter which is a combination of a refresh address counter and a burst column address counter.

DESCRIPTION OF RELATED PRIOR ART

FIG. 1 is a block diagram of a synchronous DRAM. The synchronous DRAM has a control/address input device 100, a row address counter 200, a row address decoder 300, a column counter 400, a column address decoder 500, a memory cell array 600, and a data input and output device 700 as shown in FIG. 1. The control/address input device 100 generates a signal necessary for operating an internal circuit in response to addresses A0, A1, A2, . . . An and control signals CLK, CKE, /CS, /RAS, /CAS, /WE. The row address counter 200 generates a refresh address to refresh a memory cell according to a refresh command signal by which a synchronous DRAM is operated at a refresh mode, with the refresh command signal being created by the control/address input device 100. Output signals AXO–AXn of the control/address input device 100 and the refresh address are decoded by the row address decoder 300. An internal column address is created by the column address counter 400 in response to output signals AYO–AYn of the control/address input device 100. The output signals AYO–AYn of the control/address input device 100 and output signals of the column address counter 400 are decoded by the column address decoder 500. The memory cell array 600 has a plurality of memory cells which are selected by the row address decoder 300 and the column address decoder 500. The input and output device 700 is used to input or output data from or to the memory cell array 600.

In the synchronous DRAM having the structure as described above, the refresh address counter and the burst address counter are separately designed. There is a problem in that device area and simulation time of operation waveform are increased.

SUMMARY OF THE INVENTION

Therefore, it is an object of the present invention to provide a semiconductor memory device which can count a row address to refresh a memory cell by an internal column address counter which is not used when the device is operated at a refresh operation interval by combining a row address counter for refreshing the memory cell and the internal column address counter for burst write and read.

To achieve the above object, an address count according to the present invention comprises:
a control/address input device controlled by address and control signals;
a row and column address counter operated by an output signal of said control/address input device;
a column address decoder to which output signals of said control/address input device and said row and column address counter are input;
a row address decoder to which output signals of said control/address input device and said row and column address counter are input; and
a memory cell array operated by said output signals of said row address decoder and column address decoder.

This invention is applied to a synchronous DRAM as well as to all of the semiconductor memory device that separately counts a row address and a column address.

BRIEF DESCRIPTION OF THE DRAWINGS

For a full understanding of the nature and object of the present invention, reference should be made to the following detailed descriptions made in conjunction with the accompanying drawings in which.

Like reference characters refer to those like parts in the various views of the drawings.

Detailed Description of the Invention

Below, an embodiment of the invention will be explained with reference to the accompanying drawings.

Figure 1:
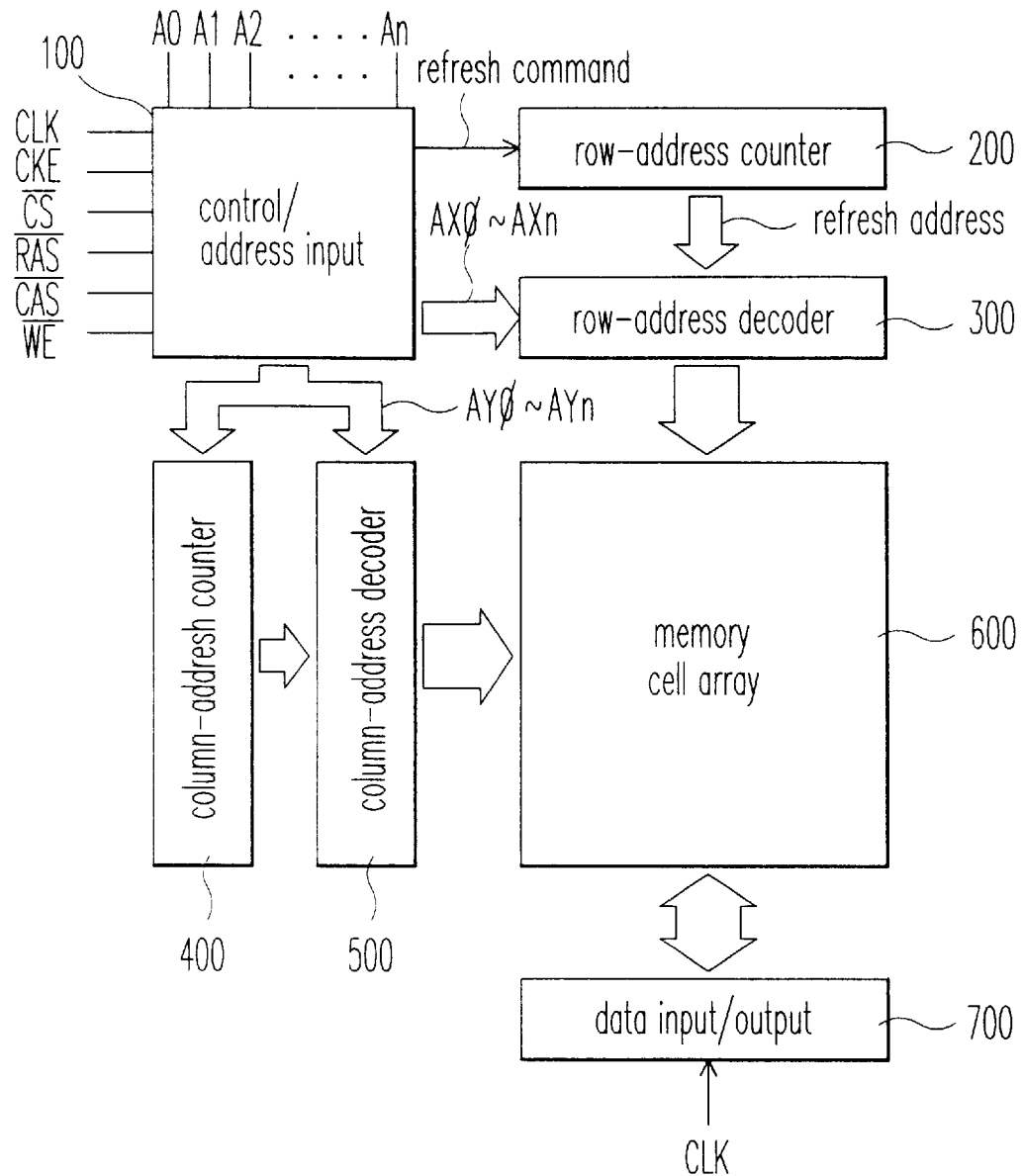
FIG. 1 is a block diagram of a synchronous DRAM according to the prior art.
Figure 2:
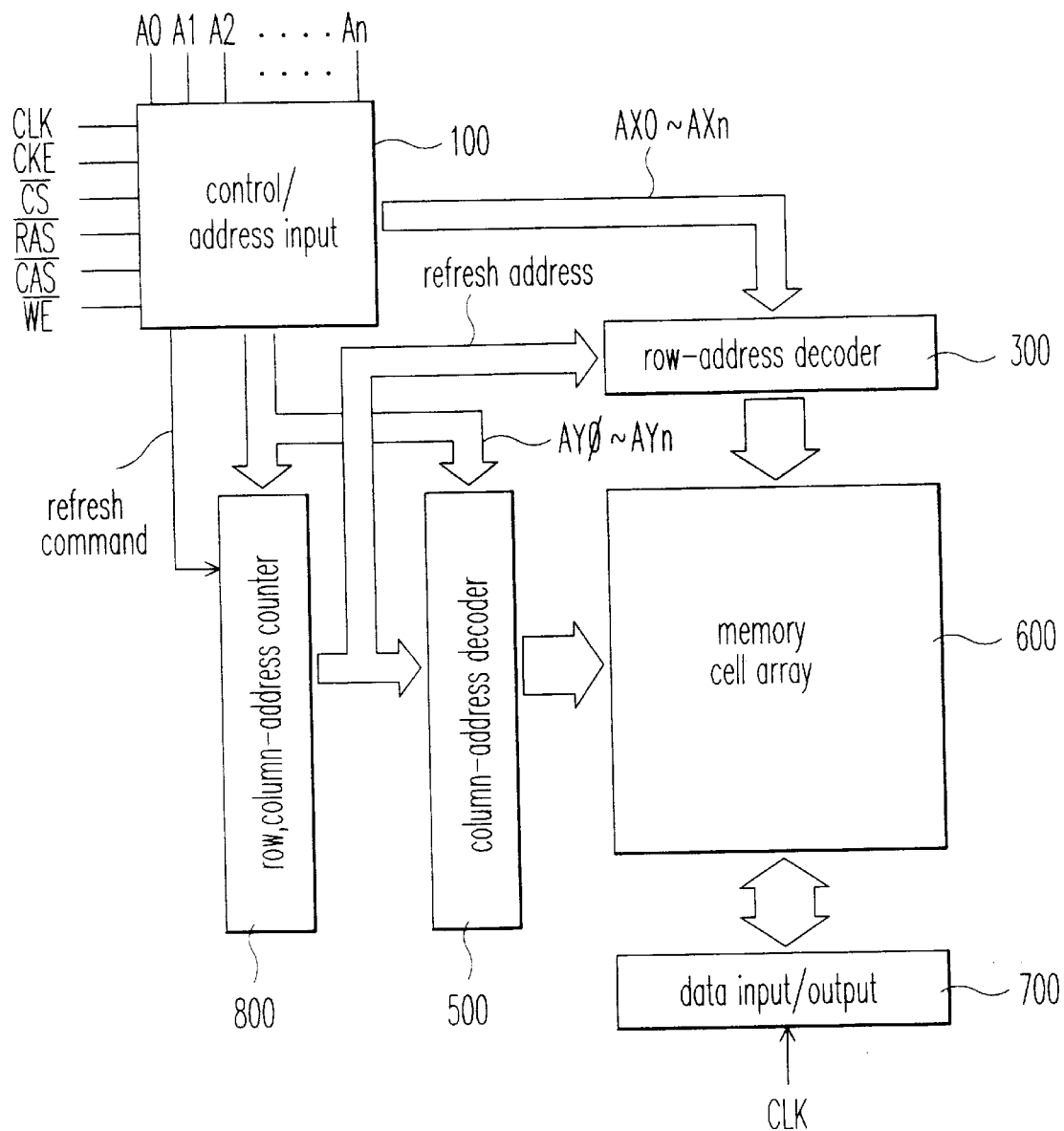
FIG. 2 is a block diagram of a synchronous DRAM according to an embodiment of the present invention.

FIG. 2 is a block diagram of a synchronous DRAM according to an embodiment of the present invention. FIG. 2 is identical to FIG. 1 except that a row address counter and a column address counter of FIG. 1 are changed to a row and column address counter. Hence, explanation of structure of FIG. 2 will be omitted.

In FIG. 2, a refresh command signal, which is generated by a control/address input device, is input to the row and column address counter and is used to operate a synchronous DRAM at a refresh mode. Output signals of the row and column address counter are input to a row address decoder 300 and a column address decoder 500. A specific memory cell of a memory cell array 600 is selected by output signals of a row address decoder 300 and a column address decoder 500.

Figure 3:
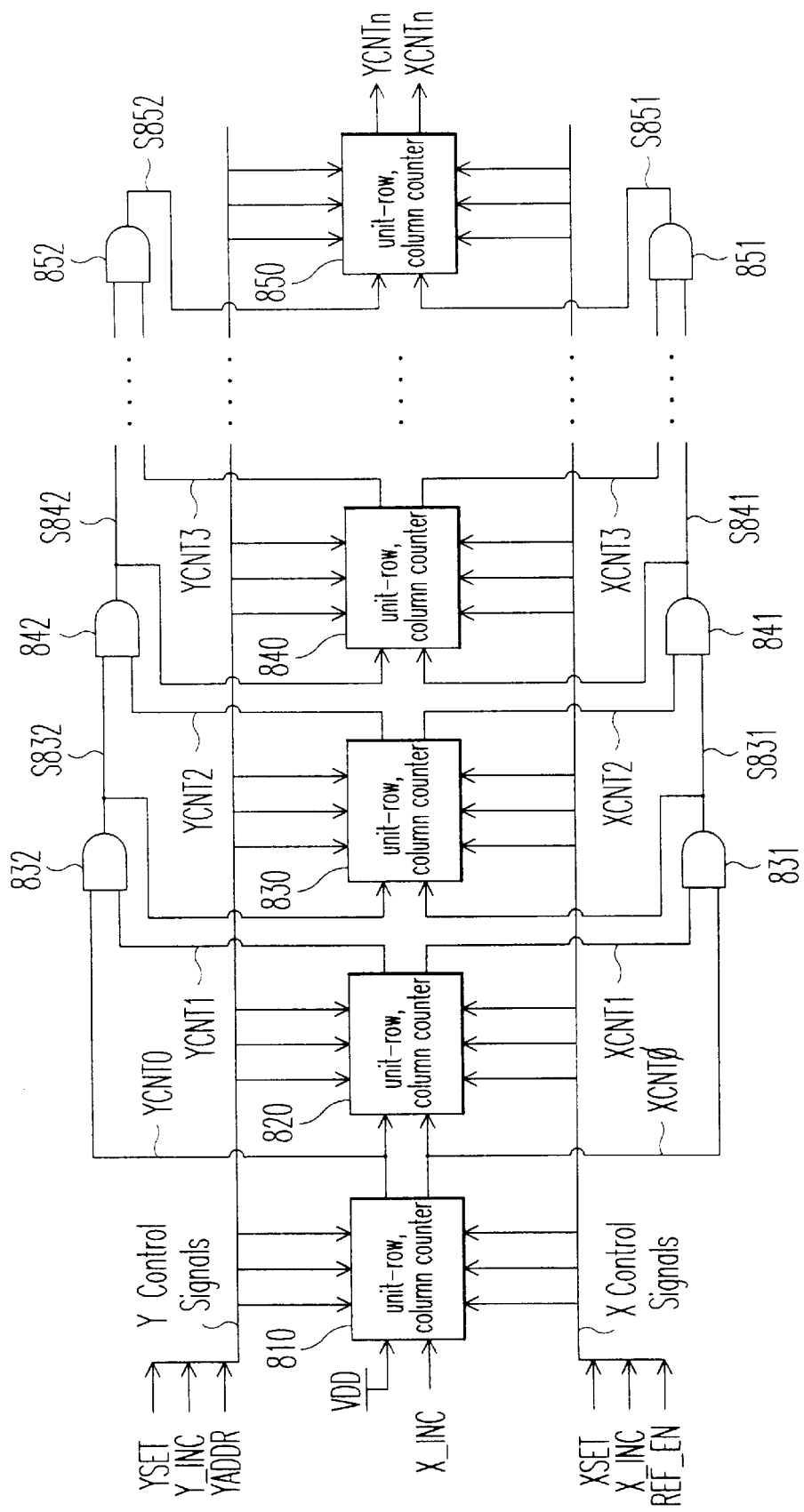
FIG. 3 is a detail circuit of a row and column address counter of FIG. 2.

FIG. 3 is a circuitry for explaining the row and column address counter of FIG. 2, in which a plurality of unit rows and column counters 810, 820, 830, 840 and 850 are connected to each other. A supply voltage VDD for the synchronous DRAM, a first increment signal X-INC for a row address counter, a refresh enable counter REF-EN, a first initialization signal XSET, a second increment signal Y-INC for an internal column address counter, a start address YADDR for a burst write and read operation, and a second initialization signal YSET are input to a first unit row and column counter 810, respectively. The first increment signal is created by the control/address input device and used to refresh a memory cell. The refresh enable signal REF-EN is generated by the control/address input device and used to recognize that the synchronous DRAM is being operated at a refresh mode. The first initialization signal is generated by the control/address input device and used to initialize the unit row and column counters 810, 820, 830, 840 and 850 by a refresh address when operation of the synchronous DRAM is started at the fresh mode. The second increment signal Y-INC is output from the control/address input device and used for the burst write and input read operation. The start address YADDR is created by the control/address input device and used for the burst write and input read operation. The second initialization signal YSET is one output of the control/address input device and used to initialize the unit row and column address counters in response to the start address YSET. Signals YCNT0 and XCNT0 are created by the first unit row and column counter 810, and input to a second unit row and column counter 820.

Also, the signals YCNT0 and XCNT0 are input to AND gates 832 and 831. In the above signals, XSET, X-INC and REF-EN signals are row control signals (X-control signals), while YSET, Y-INC and YADDR are column control signals (Y-control signal). A second unit row and column counter 820 generates output signals YCNT1 and XCNT1 in response to the output signals YCNT0 and XCNT0, the column signal, and the row control signal.

In addition, the signals YCNT0 and XCNT0 are input to AND gates 832 and 831. A third unit row and column counter 830 outputs YCNT2 and XCNT2 according to the row control signals XSET, X-INC and REF-EN, the column control signals YSET, Y-INC and YADDR, and output signals S831 and S832 of the AND gates 832 and 831.

Also, the signals YCNT2, XCNT2, S832 S831 are input to AND gates 842 and 841.

A fourth unit row and column address counter 830 creates signals of YCNT3 and XCNT3 according to the row control signals, the column control signals and output signals S841 and S842 of the AND gates 842 and 841. In the same way, a nth unit row and column address counter 850 outputs signals of YCNTn and XCNTn according to the row control signals, the column control signals, and signals S852 and S851. Here, the signals S852 and S851 are output signals of AND gates 852 and 851. Output signals of a unit row and column counter YCNTn-1 and XCNTn-1 and output signals of a previous AND gates and input into AND GATES 852 and 851.

The output signals YCNT0 and XCNT0 of the first row and column counter 810 are used to a least significant bit (LSB) in input signals of a column address decoder 500 and row address decoder 300 for the synchronous DRAM. Similarly, the output signals YCNTn and XCNTn of the nth row and column counter 850 are used to a most significant bit (MSB) in input signals of a column address decoder 500 and row address decoder 300 for the synchronous DRAM. Also, sequence of the LSB and MSB may be changed according to a refresh method of the synchronous DRAM.

Figure 4:
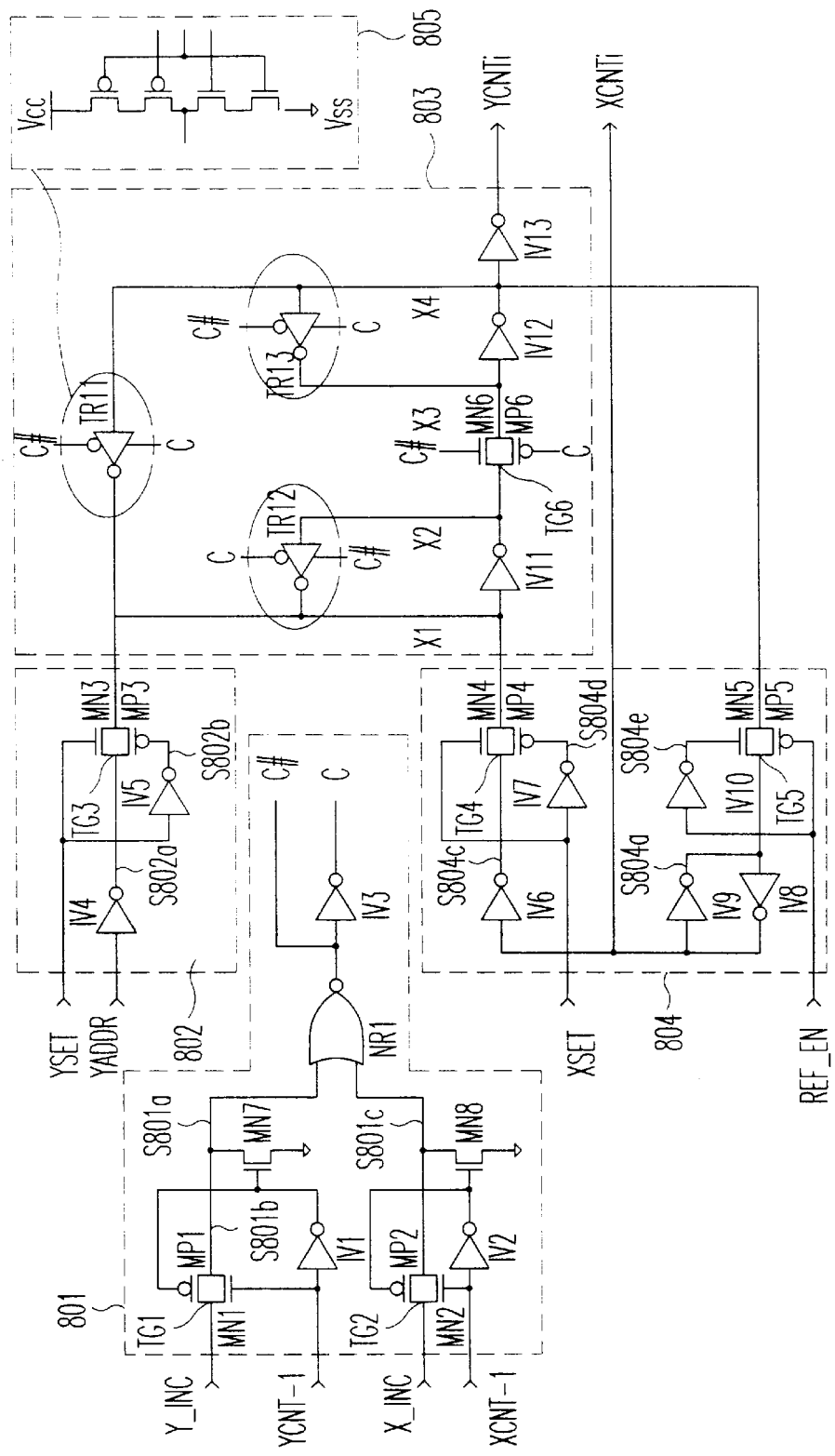
FIG. 4 is a detail circuit of an unit row and column address counter of FIG. 3.

FIG. 4 illustrates a circuitry for a unit row and column counter of FIG. 3. A first block 801 includes a first transmission gate TG1 having a first PMOS transistor MP1 and a first NMOS transistor MN1, a first inverter IV1, a seventh NMOS transistor MN7, a second transmission gate TG2 having a second PMOS transistor MP2 and a second NMOS transistor MN2, a second inverter IV2, an eighth NMOS transistor MN8, a NOR gate NR1 and a third inverter IV3. A gate electrode of the first PMOS transistor MP1 is connected to a gate electrode of the seventh NMOS transistor MN7 and a gate electrode of a first NMOS transistor MN1 is connected to an input terminal of the first inverter IV1. The signal Y-INC is transmitted to one input terminal of the NOR gate NR1 by the first transmission gate TG1. An input terminal of the first inverter IV1 is connected to the gate electrode of the first NMOS transistor MN1, while an output terminal of the first inverter IV1 is connected to the gate electrode of the seventh NMOS transistor MN7. The signal YCNT-1 is inverted and transmitted to gate electrodes of the seventh NMOS transistor MN7 and the first PMOS transistor MP1. The seventh NMOS transistor MN7 is connected between an input terminal of the NOR gate NR1 and the ground, the gate electrode thereof being connected to an output terminal of the first inverter IV1. A gate electrode of the second PMOS transistor MP2 is connected to a gate electrode of the eighth NMOS transistor MN8 and a gate electrode of a second NMOS transistor MN2 is connected to an input terminal of the second inverter IV2. The signal X-INC is transmitted to one input terminal of the NOR gate NR1 by the second transmission gate TG2. An input terminal of the first inverter IV2 is connected to the gate electrode of the second NMOS transistor MN1, while an output terminal of the second inverter IV2 is connected to gate electrodes of the eighth NMOS transistor MN8 and the second PMOS transistor MP2. The signal XCNT-1 is inverted and transmitted to gate electrodes of the eighth NMOS transistor MN8 and the second PMOS transistor MP2. The eighth NMOS transistor MN8 is connected between one input terminal of the NOR gate NOR1 and a ground terminal, the gate electrode thereof being connected to the output terminal of the second inverter IV2. The NOR gate NOR1 receives two signals Y-INC and X-INC, and outputs a signal C#. The third inverter IV3 generates a signal C by inverting the signal C#.

The first block 801 generates output signals C and C# in response to the signals Y-INC and X-INC, and output signals of the previous unit row and column counter YCNT-1 and XCNT-1, or the output signals of the previous AND gate.

The second block 802 has a third transmission gate TG3 having a third PMOS transistor MN3 and a third PMOS transistor MP3, a fourth inverter IV4 and a fifth inverter IV5. The signal YADDR is inverted and transmitted to the transmission gate TG3 by the fourth inverter IV4. The signal YSET is input to an input terminal of the fifth inverter IV5 and a gate electrode of the third NMOS transistor MN3. An output signal S802a of the fourth inverter IV4 is inverted and transmitted to a gate electrode of the third PMOS transistor MP3 by the fifth inverter IV5. The signal S802a is transmitted to a third block 803 in response to operation of the third transmission gate TG3.

The second block 802 generates output signal X according to the signal YSET and YADDR.

The fourth block 804 includes fourth and fifth transmission gates TG4 and TG5, sixth, seventh, eighth, ninth and tenth inverters IV6, IV7, IV8, IV9 and IV10. The fourth transmission gate TG4 has a fourth NMOS transistor MN4 and a fourth PMOS transistor MP4. The fifth transmission gate TG5 has a fifth NMOS transistor MN5 and a fifth PMOS transistor MP5. The signal XSET is inverted and transmitted to a gate electrode of the fourth PMOS transistor MP4 through the seventh inverter IV7. A gate electrode of the fourth PMOS transistor MP4 is connected to an output terminal of the seventh inverter IV7, while a gate electrode of the fourth NMOS transistor MN4 is connected to an input terminal of the seventh inverter IV7. An output signal S804c of the sixth inverter IV6 is transmitted to an input terminal X1 of the third block 803 according to the operation of the fourth transmission gate TG4. An input terminal of the sixth inverter IV6 is connected to an output terminal of the eighth inverter IV8 and an input terminal of the ninth inverter IV9. A signal REF-EN is inverted and transmitted to a gate electrode of the fifth NMOS transistor MN5 through the tenth inverter IV10. A gate electrode of the fifth NMOS transistor MN5 is connected to an output terminal of the tenth inverter IV10. The signal REF-EN is applied to a gate electrode of the fifth PMOS transistor MP5. A signal X of the third block 803 is transmitted to an input terminal of the eighth inverter IV8 according to the operation of the fifth transmission gate TG4. An input terminal of the ninth inverter IV8 is connected to an output terminal of the tenth inverter IV9 and an input terminal of the ninth inverter IV8 is connected to an output terminal of the tenth inverter IV9, thereby forming a latch circuit. The input terminals of the sixth inverter IV6 and the ninth inverter IV9, and the output terminal of the eighth inverter IV9 are connected to an output terminal to generate a signal XCNTi. The fourth block 804 creates the signals X1 and XCNTi in response to the signals XSET and REF-EN, and the signal X4 of the fourth block 804, in which the signal XCNTi is one of an input signal in the row address decoder 300.

The fourth block 804 has a sixth transmission gate TG6 having a sixth NMOS transistor MN6 and a sixth PMOS transistor MP6, eleventh, twelfth, thirteenth inverters IV11, IV12 and IV13, first, second and third tri-state inverters TR11, TR12 and TR13. An input terminal of the eleventh inverter IV11 is connected to a connection node Xi of the third and fourth transmission gates TG3 and TG4, while an output terminal of the eleventh inverter IV11 is connected to the transmission gate TG6. The second tri-state inverter TR12 is connected between the connection node X1 and the output terminal of the eleventh inverter IV11. The signal C# is applied to a gate electrode of the sixth NMOS transistor MN6, while the signal C is applied to the sixth PMOS transistor MP6. An output signal of the eleventh inverter IV11 is transmitted to an input terminal of twelfth inverter IV12. The sixth transmission gate TG6 is connected between connection nodes X2 and X3, the connection node X3 being connected to the twelfth inverter IV12. The twelfth inverters IV12 is connected between the connection nodes X3 and X4. The third tri-state inverter TR13 is connected between the connection nodes X3 and X4. The first tri-state inverter TR11 is connected between the connection nodes X4 and X1. An output signal of the twelfth inverter IV12 is inverted through the thirteenth inverter IV13, thereby creating a signal YCNTi.

The third block 803 outputs the signal YCNTi, which is one of input signals of the column decoder 500, according to the signals X1, C and C#. The signal YCNTi is input into the next unit row and column counter or into one of the AND gates.

A fifth block 805 is a circuit to embody the tri-state inverter TRII, TR12 or TR13 of the third block 803 in a type of MOSFET.

Figure 5:
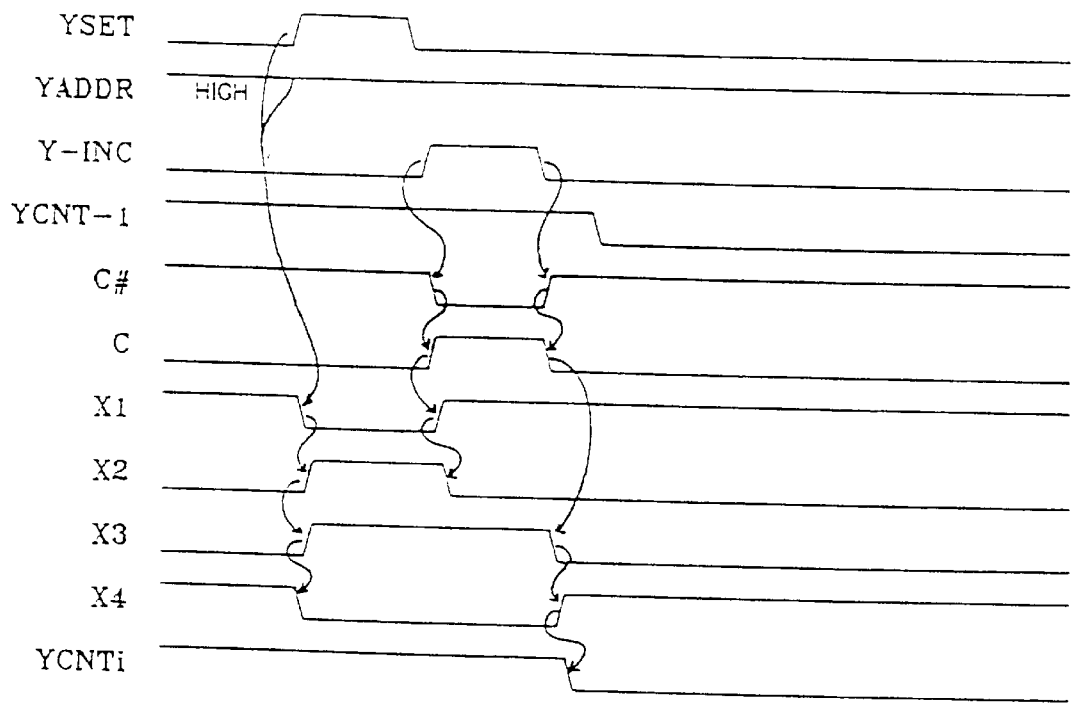
FIG. 5 is a timing diagram for explaining a column address counter of FIG. 4.

Next, the electrical operation of FIG. 4 will be explained. Firstly, when the synchronous DRAM performs a burst write and read operation, the signals XSET and X-INC maintain a logical low state, while the signals maintain a logical high state. Although an output of the previous unit row and column counter XCNT-1 maintains a logical low or logical high state, a node S801c always maintains a logical low state. Hence, the NOR gate is controlled by potential of a node S801a, and the fourth transmission gate TG4 having the fourth NMOS transistor MN6 and fourth PMOS transistor MP6 is opened (A node S804c is opened to a node X1). The fifth transmission gate TG5 having a fifth NMOS transistor MN5 and the fifth PMOS transistor MP5 is also opened (A node S804a is opened to a node X4), whereby the third block 803 is opened to the fourth block 804. When a burst write and read command is input into the synchronous DRAM, one positive going pulse is generated and the column address YADDR, which is input from the outside and is an output of the control/address input device 100, is transmitted to the node X1 by the signal YSET. The signal Y-INC is transmitted to a node S801a when an output signal of previous unit row and column counter YCNT-1 maintains a logical high state. The signal Y-INC is not transmitted to a node S801a when an output signal of previous unit row and column counter YCNT-1 maintains a logical low state. Accordingly, a negative going pulse C# is generated at an output terminal of the NOR gate NR1 since the signal Y-INC is transmitted to the NOR gate NOR1 through the node S801a while the signal YCNT-1 maintains a logical high state. A positive going pulse C is created at an output of the inverter IV3. Potentials of the nodes X1, X2,X3 and X4 of a third block 803 are changed by the positive and negative going pulses C and C#. Such operation is depicted in the timing diagram of FIG. 5.

Secondly, when the synchronous DRAM enters a refresh mode, the signals YSET and Y-INC maintain a logical low state and a third transmission gate TG3 having the third NMOS transistor MN3 and the third PMOS transistor MP3 is opened. Although the signal YCNT-1 maintains a logical low state or a logical high state, the node S801a maintains a logical low state, whereby the NOR gate NOR1 is controlled by the potential of the node S801c. The signal XSET has a positive going pulse when a refresh command is input to the synchronous DRAM. The fourth transmission gate TG4 having the fourth NMOS transistor MN4 and the fourth PMOS transistor MP4 is turned on by means of the signal XSET, whereby the signal XCNTi, which is latched to the inverters IV8 and IV9, is transmitted to the node X1. At this time, since the signal REF-EN maintains a logical low state, a signal of the node X4 is not transmitted to the node S804a. When the signal X-INC is delayed for a specific time in the signal XSET and generates a positive going pulse, the node S801c receives the signal XINC or maintains a logical low state. For example, when the node S801c maintains a logical low state, the signals C and C# have a positive going pulse and a negative going pulse, respectively, whereby potentials of the nodes X1, X2, X3 and X4 in the count circuit block 803 are transmitted.

Figure 6:
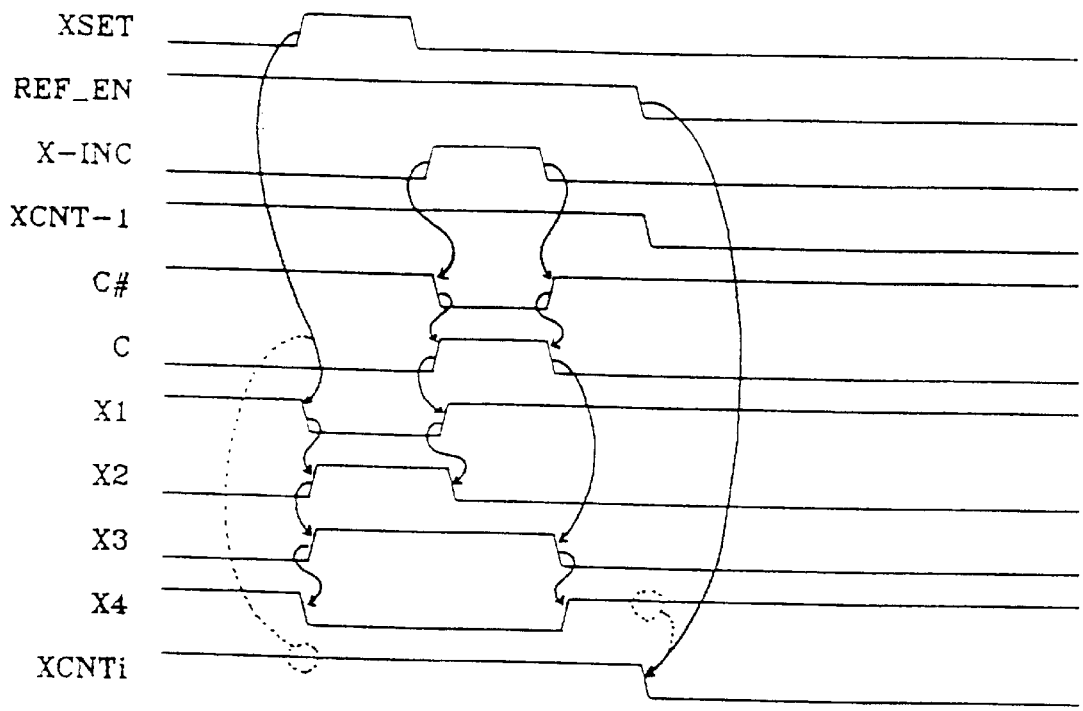
FIG. 6 is a timing diagram for explaining a row address counter of FIG. 4.

Also, the signal REF-EN is transmitted to a logical low state and state of the nodes X4 is transmitted to a node S804a, thereby outputting the signal XCNTi. Such operation is depicted in a timing diagram of FIG. 6.

As described above, when a row address counter and a column address counter both consist of an identical counter, an internal row address generation time during a refresh mode and an internal column address generation time during a burst write and read mode can be synchronized to a clock. Accordingly, a semiconductor memory device of the present invention can decrease chip area and simulation time of operation waveform as well as simplify operation of a synchronous DRAM. Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the sprit and scope of the invention.

What is claimed is:

1. A semiconductor memory device comprising:
   a) a control/address input device controlled by address and control signals;
   b) a row and column address counter operated by an output signal of said control/address input device;
   c) a column address decoder to which output signals of said control/address input device and said row and column address counter are input;

d) a row address decoder to which output signals of said control/address input device and said row and column address counter are input; and e) a memory cell array operated by output signals of said row address decoder and column address decoder;

wherein said row and column address counter includes:
1) a first unit row and column counter for outputting:
   1a) a first column count signal and
   1b) a first row count signal; according to:
   1c) a column control signal and
   1d) a row control signal;
2) a second unit row and column counter for outputting:
   2a) a second column count signal and
   2b) a second row count signal; according to:
   2c) said column control signal,
   2d) said row control signal,
   2e) said first column count signal and
   2f) said first row count signal; and
3) at least one gate for logically operating on:
   3a) said first column count signal and
   3b) said second column count signal: and for providing an output to a third unit row and column counter.

2. A semiconductor memory device comprising:

a) a control/address input device controlled by address and control signals;

b) a row and column address counter operated by an output signal of said control/address input device;

c) a column address decoder to which output signals of said control/address input device and said row and column address counter are input;

d) a row address decoder to which output signals of said control/address input device and said row and column address counter are input; and e) a memory cell array operated by output signals of said row address decoder and column address decoder;

wherein said row and column address counter includes:
1) a first unit row and column counter for outputting:
   1a) a first column count signal and
   1b) a first row count signal; according to:
   1c) a column control signal and
   1d) a row control signal;
2) a second unit row and column counter for outputting:
   2a) a second column count signal and
   2b) a second row count signal; according to:
   2c) said column control signal,
   2d) said row control signal,
   2e) said first column count signal and
   2f) said first row count signal;
3) a first AND gate for logically operating on:
   3a) said first column count signal and
   3b) said second column count signal; and for providing an output to:
   3c) a third unit row and column counter, and
   3d) a terminal of a third AND gate;
4) a second AND gate for logically operating on:
   4a) said first row count signal and
   4b) said second row count signal; and for providing an output to:
   4c) said third unit row and column counter, and
   4d) a terminal of a fourth AND gate;
5) said third unit row and column counter for outputting:
   5a) a third column count signal and
   5b) a third row count signal; according to:
   5c) said column control signal,
   5d) said row control signal, and
   5e) the outputs of said first and second AND gates;
6) said third AND gate for logically operating on:
   6a) the output of said first AND gate and
   6b) said third column count signal; and for providing an output to:
   6c) a fourth unit row and column counter, and
   6d) a terminal of a fifth AND gate;
7) said fourth AND gate for logically operating on:
   7a) the output of said second AND gate and
   7b) said third row count signal; and for providing an output to:
   7c) said fourth unit row and column counter, and
   7d) a terminal of a sixth AND gate; and
8) a nth row and column counter for outputting:
   8a) a nth column count signal and
   8b) a nth row count signal; according to:
   8c) said column control signal,
   8d) said row control signal,
   8e) an output signal of a (2n-3)th AND gate and
   8f) an output signal of a (2n-2)th AND gate, wherein n is an integer 2, 3 . . . .

3. A semiconductor memory device comprising:

a) a control/address input device controlled by address and control signals;

b) a row and column address counter operated by an output signal of said control/address input device;

c) a column address decoder to which output signals of said control/address input device and said row and column address counter are input;

d) a row address decoder to which output signals of said control/address input device and said row and column address counter are input; and e) a memory cell array operated by output signals of said row address decoder and column address decoder;

wherein said row and column address counter includes at least one unit row and column counter that includes:
1) a first transmission gate for outputting a column increment signal to a first terminal of a NOR gate according to a column count signal;
2) a second transmission gate for outputting a row increment signal to a second terminal of said NOR gate according to a row count signal; and
3) said NOR gate for logically operating on said column increment signal and said row increment signal and for outputting a signal adapted to control tri-state inverters.

4. A semiconductor memory device comprising:

a) a control/address input device controlled by address and control signals;

b) a row and column address counter operated by an output signal of said control/address input device;

c) a column address decoder to which output signals of said control/address input device and said row and column address counter are input;

d) a row address decoder to which output signals of said control/address input device and said row and column address counter are input; and e) a memory cell array operated by output signals of said row address decoder and column address decoder;

wherein said row and column address counter includes a unit row and column address counter that includes:
1) a first transmission gate for outputting a start address signal for burst write and read operation to a first tri-state inverter and an output terminal of a second transmission gate, wherein said first transmission gate is controlled by a signal to initialize unit row and column counters;

2) said second transmission gate for outputting an output signal of a third transmission gate, wherein said second transmission gate is controlled by the signal to initialize said unit row and column counters by means of a refresh address; and 3) said first tri-state inverter, and second and third tri-state inverters, and a fourth transmission gate for outputting a column count signal in response to an output signal of said second transmission gate.

5. A semiconductor memory device comprising:

a) a control/address input device controlled by address and control signals;

b) a row and column address counter operated by an output signal of said control/address input device;

c) a column address decoder to which output signals of said control/address input device and said row and column address counter are input;

d) a row address decoder to which output signals of said control/address input device and said row and column address counter are input; and e) a memory cell array operated by output signals of said row address decoder and column address decoder;

wherein said row and column address counter includes at least one unit row and column counter that includes:

1) a first transmission gate for outputting a column increment signal to a NOR gate, wherein said first transmission gate is controlled by a column count signal;

2) a second transmission gate for outputting a row increment signal to an output terminal of said NOR gate in response to a row count signal;

3) said NOR gate for logically combining said column increment signal and said row increment signal, thereby outputting a signal adapted to control tri-state inverters;

4) a third transmission gate for outputting a start address for a burst write and read operation to a first tri-state inverter and a fourth transmission gate, wherein said third transmission gate is controlled by a signal to initialize unit row and column counters;

5) said fourth transmission gate, controlled by the signal to initialize said unit row and column counters by a refresh address, wherein said fourth transmission gate outputs an output signal of a fifth transmission gate;

6) said fifth transmission gate for outputting an output signal of said first tri-state inverter to said fourth transmission gate, wherein said fifth transmission gate is controlled by a refresh enable signal; and 7) said first tri-state inverter, and second and third tri-state inverters, and a sixth transmission gate for outputting a column count signal in response to an output signal of said fourth transmission gate.

* * * * *